United States Patent [19]

Wurst et al.

[11] Patent Number: 5,047,722
[45] Date of Patent: Sep. 10, 1991

[54] APPARATUS FOR MEASURING INTERNAL RESISTANCE OF WET CELL STORAGE BATTERIES HAVING NON-REMOVABLE CELL CAPS

[75] Inventors: John W. Wurst, Far Hills; Stephen A. Garron, Elizabeth; Allan M. Dob, Clifton, all of N.J.

[73] Assignee: SSMC Inc., Edison, N.J.

[21] Appl. No.: 338,688

[22] Filed: Apr. 17, 1989

[51] Int. Cl.$^5$ ............................................. G01N 27/26
[52] U.S. Cl. ..................................... 324/430; 324/434; 324/436
[58] Field of Search ............... 324/430, 434, 436, 427, 324/429; 340/636; 320/48

[56] References Cited

U.S. PATENT DOCUMENTS

| 3,676,770 | 7/1972 | Sharaf et al. | 324/430 |
| 4,204,162 | 5/1980 | Froidevaux | 324/430 |
| 4,361,809 | 11/1982 | Bil et al. | 324/429 X |
| 4,719,428 | 1/1988 | Liebermann | 324/436 |
| 4,816,768 | 3/1989 | Champlin | 324/436 X |

Primary Examiner—Kenneth A. Wieder
Assistant Examiner—Robert W. Mueller
Attorney, Agent, or Firm—Theodore Jay

[57] ABSTRACT

Apparatus for measuring the total internal resistance of a multicell battery having positive and negative terminals employs a first transistor device having an input and an output and having mutually exclusive conductive and non-conductive electric states. An arrangement of resistances is connected in series with the device to form a network. The network is connected between the positive and negative terminals. An operational amplifier has an output connected to the input of the device and first and second inputs. The first input is connected to the network at a point connected to both of the device and the arrangement. A square wave signal alternating between a positive voltage and ground on alternate half cycles is applied to the second input. The device is in the conductive state when the alternating voltage is positive and is in the non-conductive state when the alternating voltage is at ground. The network conducts no current when the device is in the non-conductive state and conducts a current of constant value when the device is in the conductive state. The voltage appearing between the terminals as a result of the current in the network is monotonically related to the internal resistance of the battery.

5 Claims, 2 Drawing Sheets

APPARATUS FOR MEASURING INTERNAL RESISTANCE OF WET CELL STORAGE BATTERIES HAVING NON-REMOVABLE CELL CAPS

BACKGROUND OF THE INVENTION

Wet cell storage batteries contain a plurality of individual cells closed by individual caps. Such batteries fall into two categories, the first category employing caps which are designed to be removable, the second category employing caps which are sealed and are not normally removable.

In order to monitor the condition of batteries in the first category to determine whether the battery is in good condition or needs replacement, it is known to remove the cap of each cell to check and replenish the electrolyte level as needed and also to measure the specific gravity of the electrolyte. If all cells as tested individually are found to be in good condition, the battery will function properly; if one or more cells are found not to be in good condition, the battery should be replaced.

In order to monitor the condition of batteries in the second category, the electrolyte level and specific gravity of the electrolyte in each cell cannot be measured separately because of the sealed cap.

The present invention is directed toward apparatus for monitoring the condition of batteries in the second category by making use only of the positive and negative battery terminals.

SUMMARY OF THE INVENTION

It is known that the internal resistance of an individual cell of a wet cell storage battery increases when the condition of the cell deteriorates because its state of charge decreases and/or when contamination or decomposition products cause internal charge leakage. Since the internal resistance of a storage battery is equal to the sum of the internal resistances of the internally interconnected individual cells, as the condition of one or more cells deteriorate, the internal resistance of the battery increases. Therefore, the condition of a storage battery in the second category can be determined by measuring its internal resistance whereby one range of values of internal resistance can be used to classify the condition of a battery as acceptable and a second and higher range of values can be used to classify the condition of a battery as nonacceptable whereby the battery should be replaced.

In accordance with the principles of this invention, apparatus is provided for measuring the total internal resistance of a multicell battery having positive and negative terminals using only these terminals. To this end, the apparatus employs first transistor means having an input and an output and having mutually exclusive conductive and non-conductive electric states. Second resistor means connected in series with said first means forms a network therewith, the network being connected between the positive and negative terminals of the battery. The invention also employs an operational amplifier having an output connected to the input of the first means and first and second inputs, the first input being connected to said network at a point connected to both of the first and second means.

Third means applies to the second input of the operational amplifier an alternating voltage which changes polarity on alternate half cycles. The first means is placed in the conductive state when the voltage is of one polarity and is placed in the non-conductive state when the voltage is of the other polarity. The network conducts no current when the first means is in the non-conductive state and conducts a current of constant value when the first means is in the conductive state. The voltage appearing between the terminals as a result of the current flow in the network is monotonically related to the internal resistance of the battery and thus provides a measurement of the internal resistance.

DETAILED DESCRIPTION OF PREFERRED EMBODIMENT

Figure 1:
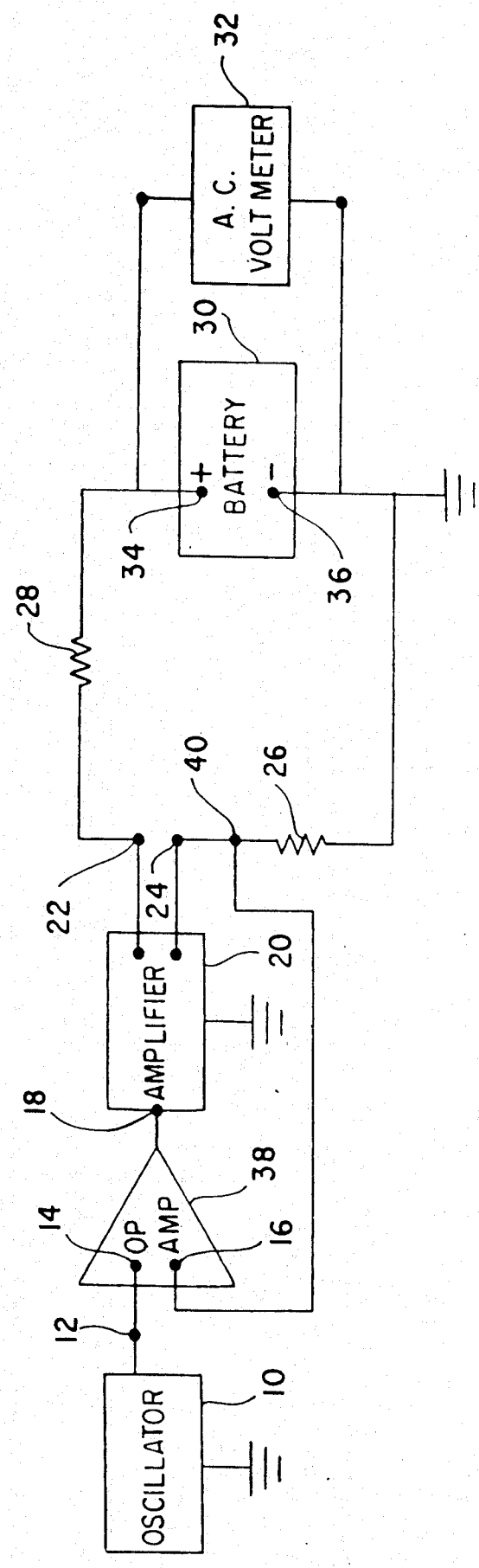
FIG. 1 is a block diagram of a preferred embodiment of the invention.
Figure 3:
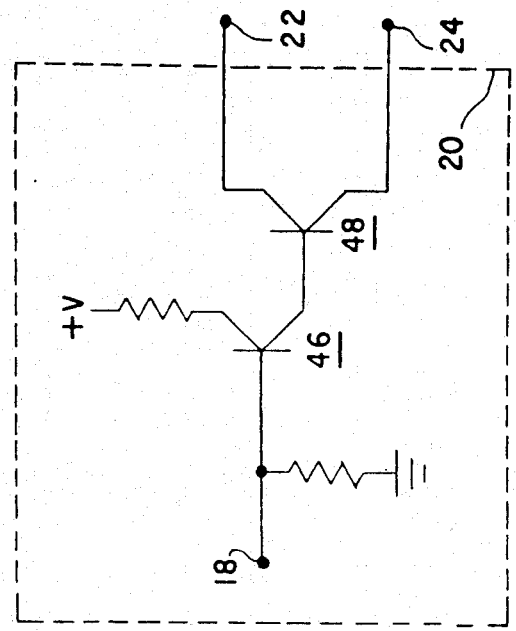
FIGS. 2 and 3 are corresponding circuit diagrams of orm in FIG. 1.
Figure 2:
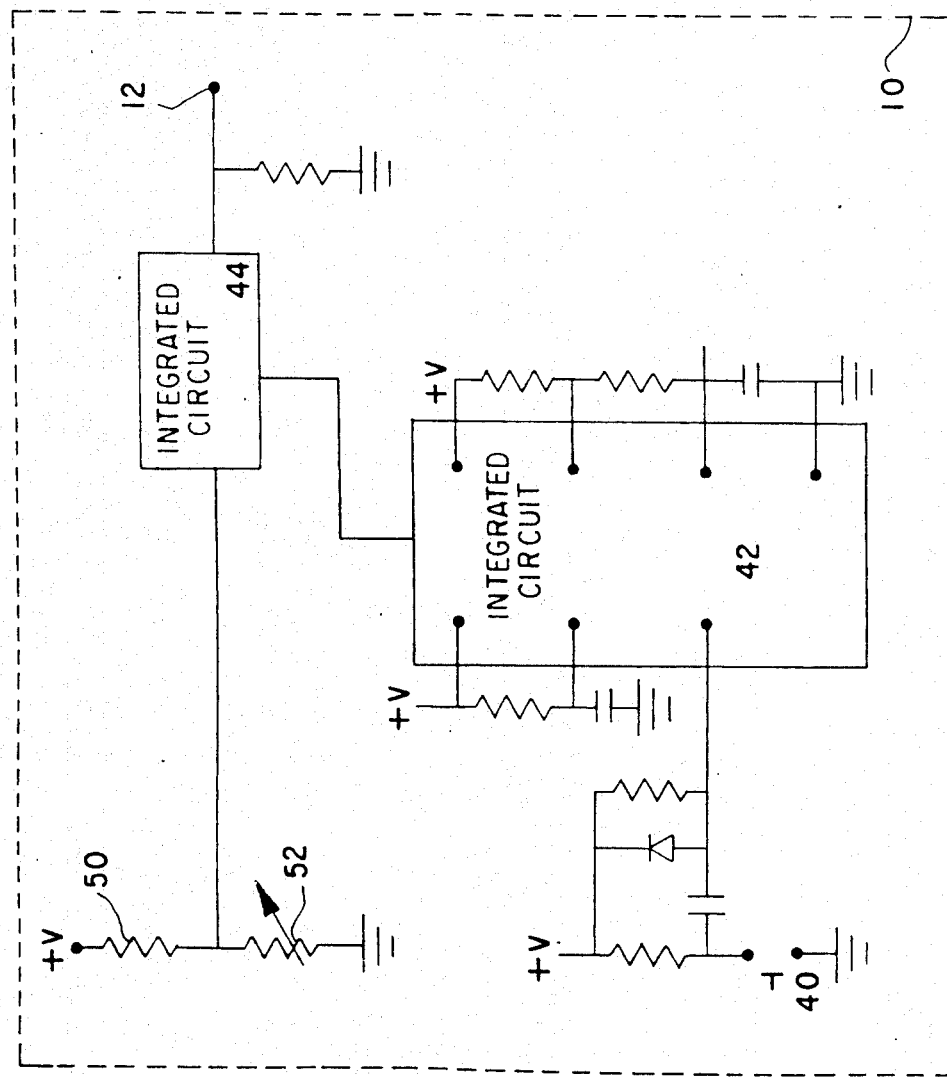

In the embodiment shown in FIGS. 1-3, a twelve volt six cell battery is to be evaluated. As an example, it can be assumed that the total internal resistance of a good battery is about 0.005 ohms or about 0.000833 ohms per cell. The internal resistance of a bad cell can be assumed to be about five times as large as a good cell or about 0.00417 ohms per cell. Under these conditions, a battery having five good cells and one bad cell will have an internal resistance of about 0.00834 ohms.

If a load sufficient to stress the battery mildly, as for example ten amperes, is applied to the battery, a direct voltage drop across the battery terminals of about 0.050 volts will be produced when the battery with six good cells is used and as compared to a direct voltage drop of about 0.083 volts when the battery with five good cells and one bad cell is used.

As a percentage change, the difference between the direct voltage drop of the good battery and the direct voltage drop of the bad battery can be seen easily. However, normal direct voltage variations in battery terminal voltages can be larger than such differences and thus mask them. In this invention, the load current is switched on and off at a relatively low frequency, as for example sixty Hz, and an alternating current voltmeter can be used to measure the resultant voltage drop. In this manner, the masking action is avioded and the voltage drop, being monotonically related to the internal resistance can be used as a measure of the internal resistance.

Referring now to FIG. 1, a square wave signal of fixed frequency as for example sixty Hz alternating between a positive voltage and ground is produced at the output 12 of oscillator 10 and is supplied to input 14 of operational amplifier 38. The output 18 of amplifier 38 is supplied to the input of amplifier 20. One output lead 22 of amplifier 20 is connected via resistor 28 to the positive terminal 34 of twelve volt battery 30. The other output lead 24 is connected via resistor 26 to the negative terminal 36 of battery 30. An alternating current voltmeter 32 is connected between terminals 34 and 36. The junction 40 of lead 24 and resistor 26 is connected to another input 16 of amplifier 20. Resistor 28 has a value of one ohm. Resistor 26 has a value of one tenth of an ohm.

The amplifier 20 is switched off and on by the amplifier 38 during alternate positive and ground cycles of the oscillator output whereby either no current flows through resistances 26 and 28 and the battery or a current of ten amperes flows through these resistances and battery. The feedback connection between junction 40 and input 16 maintains the current at the ten ampere value when amplifier 20 conducts. The voltmeter 32 then responds to the RMS value of the voltage drop appearing between terminal 34 and 36 as a result of this process and the internal resistance can be calculated using the average value. The internal resistance increases with increases in the voltage drop and decreases with decreases in the voltage drop whereby the voltage drop and the internal resistance have monotonically related values.

As shown in FIG. 2, when switch 40 momentarily closed, the integrated circuit 42 is actuated. This circuit 42 commercially identified as type 556 consists of two half sections. The first half of circuit 42 is a monostable multivibrator which produces a single square wave pulse having a duration of about one second. This pulse actuated the second half of the circuit 42 which produces a square wave pulse train in the presence of the single pluse having a recurrence frequency of about sixty Hz. This train of pulses is supplied to a second integrated circuit 44 commercially identified as type CD4016. Circuit 44 acts as a switch which is opened and closed by the pulse train at the same recurring frequency. Typically a battery voltage of plus nine volts is impressed across the voltage divider resistor network 50 and 52, so that the voltage across resistor 52 is applied to the input 14 of operational amplifier each time the switch of circuit 44 is closed. Resistor 52 is a variable resistor and is adjusted to set the desired current flow of ten amperes previously described.

The amplifier 20 as shown in FIG. 3 consists of a driver transistor 46 and a power transistor 48. When the switch of circuit 44 is closed, transistor 46 conducts, causing transistor 48 to conduct whereby the current flow of ten amperes is abruptly produced. When the switch of circuit 44 is open, both transistors 46 and 48 are non-conductive and the current flow of ten amperes abruptly drops to zero.

What is claimed

1. Apparatus for measuring the total internal resistance of a multicell battery having spaced apart positive and negative terminals comprising:

first transistor means having an input circuit and an output circuit and having mutually exclusive conductive and non-conductive electric states;

second resistance means connected in series with the output circuit of said first means to form a network, said network being connected between said positive and negative terminals;

an operational amplifier having an output circuit connected to the input circuit of the first means and first and second input circuits, the first input circuit of the amplifier being connected to said network at a point connected to both of the first and second means; and third means including an oscillator to apply an alternating voltage to the second input circuit of the amplifier, the alternating voltage changing polarity on alternate half cycles, the first means being in the conductive state when the alternating voltage is of one polarity and being in the non-conductive state when the alternating voltage is of the other polarity, said network conducting no current when the first means is in the non-conductive state and conducting a current of constant value when the first means is in the conductive state, the voltage appearing between the positive and negative terminals as a result of the current flow in the network being monotonically related to the internal resistance of the battery.

2. Apparatus of claim 1 wherein said second means includes first and second resistances, and the output circuit of the first means includes first and second spaced apart leads, the first resistance being connected to the first lead, the second resistance being connected to the second lead.

3. Apparatus of claim 2 wherein the value of the first resistance is much larger than the value of the second resistance, the first input circuit of the amplifier being connected to the second lead.

4. Apparatus of claim 3 wherein said first means includes a drive transistor and a power transistor, the drive transistor having an input circuit defining the input circuit of the first means, the power transistor having an output defining the output circuit of the first means, the drive transistor having an output circuit, the power transistor having an input circuit, the output circuit of the drive transistor being connected to the input circuit of the power transistor.

5. Apparatus of claim 4 wherein the alternating voltage has the shape of a square wave.

* * * * *